US007071057B2

United States Patent
Park

(10) Patent No.: US 7,071,057 B2
(45) Date of Patent: Jul. 4, 2006

(54) METHODS OF FABRICATING MIM CAPACITORS OF SEMICONDUCTOR DEVICES

(75) Inventor: Jeong Ho Park, Icheon (KR)

(73) Assignee: Dongbu Electronics, Co., Ltd., Seoul (KR)

( * ) Notice: Subject to any disclaimer, the term of this patent is extended or adjusted under 35 U.S.C. 154(b) by 0 days.

(21) Appl. No.: 11/027,312

(22) Filed: Dec. 30, 2004

(65) Prior Publication Data

US 2005/0170583 A1 Aug. 4, 2005

(30) Foreign Application Priority Data

Dec. 31, 2003 (KR) ...................... 10-2003-0102046

(51) Int. Cl.
*H01L 21/8242* (2006.01)
(52) U.S. Cl. ...................................... 438/253; 438/396
(58) Field of Classification Search ........ 438/250–256, 438/393–399
See application file for complete search history.

(56) References Cited

U.S. PATENT DOCUMENTS

| 6,271,084 B1 | 8/2001 | Tu et al. ..................... 438/253 |
| 6,391,713 B1 * | 5/2002 | Hsue et al. .................. 438/253 |
| 6,717,193 B1 | 4/2004 | Olewine et al. ............. 257/295 |
| 6,794,262 B1 | 9/2004 | Ning et al. .................. 438/396 |
| 6,958,509 B1 * | 10/2005 | Korner et al. .............. 257/306 |
| 2005/0082592 A1 * | 4/2005 | Chang et al. ............... 257/306 |

* cited by examiner

*Primary Examiner*—H. Jey Tsai
(74) *Attorney, Agent, or Firm*—Saliwanchik, Lloyd & Saliwanchik

(57) ABSTRACT

Methods of fabricating a MIM capacitor and a dual damascene structure of a semiconductor device are disclosed. A disclosed method comprises forming a first conducting material as a lower interconnect on a semiconductor substrate; sequentially depositing second and third insulating layers over the first conducting layer; performing a first damascene process to form via holes and a trench within the second and the third insulating layers; filling the via holes and the trench to form a first contact plug connected to a lower interconnect and a second contact plug to contact the lower electrode of a MIM capacitor; forming the MIM capacitor over the second contact plug; sequentially depositing fourth and fifth insulating layers over the entire surface of the resulting structure; performing a second damascene process to form a via hole and a trench within the fourth and the fifth insulating layers; and filling the via hole and the trench to form a contact plug in contact with the upper electrode of the capacitor and another contact plug connected to the lower metal interconnect.

10 Claims, 6 Drawing Sheets

METHODS OF FABRICATING MIM CAPACITORS OF SEMICONDUCTOR DEVICES

FIELD OF THE DISCLOSURE

The present disclosure relates generally to semiconductor devices and, more particularly, to methods of fabricating metal-insulator-metal (MIM) capacitors of semiconductor devices.

BACKGROUND

In recently developed merged memory logic (MML), a memory cell array such as dynamic random access memory (DRAM) and a logic array such as analog circuits or peripheral circuits are integrated in a single chip. With the advent of MML, multimedia functions have been greatly improved and, high-integration and high-speed operation of semiconductor devices have been more effectively achieved.

On the other hand, to achieve the high-speed operation of analog circuits, a capacitor with high capacitance is in development. Generally, in a capacitor having a polysilicon-insulator-polysilicon (PIP) structure, the interface between the dielectric and the upper/lower electrodes may be oxidized to form a natural oxide layer because the upper and lower electrodes are made of polysilicon. Such natural oxide layer may lower the total capacitance of the capacitor. In addition, the capacitance of the capacitor may be reduced due to depletion regions which are created in the polysilicon layer. Such a capacitor has a low capacitance and is unsuitable for devices requiring high-speed and high-frequency operation.

To obviate these problems, new capacitor structures such as metal-insulator-silicon (MIS) and metal-insulator-metal (MIM) have been suggested. The MIM capacitor is widely used in high performance semiconductor devices because it has low specific resistance and no parasitic capacitance due to depletion regions. Recently, technology for forming a metal interconnect of a semiconductor device by using copper with low specific resistance instead of aluminum has been introduced. Therefore, various MIM capacitors with copper electrodes are being suggested.

FIGS. 1a and 1b are cross-sectional views illustrating a conventional process of fabricating a MIM capacitor and a dual damascene structure interconnect of a semiconductor device. Referring to FIG. 1a, a lower insulating layer 10 is deposited on a semiconductor substrate 1. A first metal interconnect 15 and a second metal interconnect 20 are then formed in the lower insulating layer 10. After a metal layer is deposited over the resulting structure, a portion of the metal layer is removed to form a lower electrode 25 of a capacitor on the second metal interconnect 20. A dielectric layer 30 is then deposited over the semiconductor substrate 1 including over the lower capacitor electrode 25. After a second metal layer is deposited on the dielectric layer 30, a portion of the second metal layer is removed to form an upper electrode 35 of the capacitor on the lower electrode 25. Next, an interlayer dielectric (ILD) layer 40 is deposited over the resulting structure.

Referring to FIG. 1b, the ILD layer 40 is planarized by a chemical mechanical polish (CMP) process. Some portion of the ILD layer 40 and the dielectric layer 30 is then removed by using an etching process to form a via hole $V_1$ through the ILD layer 40. The via hole $V_1$ exposes a portion of the top surface of the first metal interconnect 15. Next, a first trench $T_1$ is formed in the upper part of the via hole VI.

A second trench $T_2$ is formed through the ILD layer 40 on the upper electrode 35. The second trench $T_2$ exposes a portion of the top surface of the upper electrode 35. The via hole $V_1$, the first trench $T_1$, and the second trench $T_2$ are filled with copper and then planarized by a CMP process. As a result, a damascene structure interconnect 45 and a contact plug 50 are completed.

However, the above-described prior art process of fabricating an MIM capacitor and a dual damascene structure interconnect has several problems. First, the above-described process requires an additional metal interconnect process to form a metal interconnect to apply a bias to the lower electrode of the capacitor. In addition, the above-described process is rather complicated because the via hole and the trench on the upper electrode are formed by using separate unit processes.

DETAILED DESCRIPTION

Figure 1A:
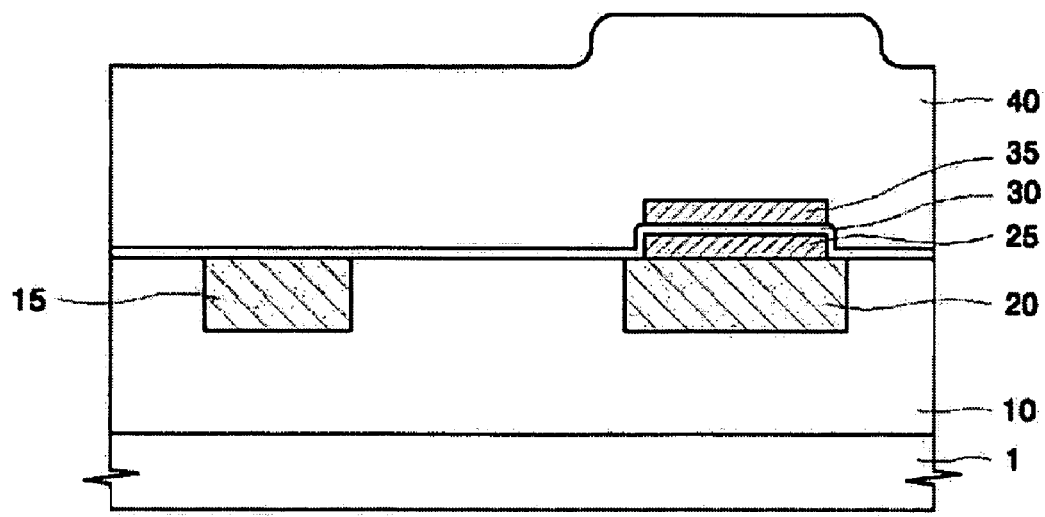
FIGS. 1a and 1b are cross-sectional views illustrating a prior art process of fabricating a MIM capacitor and a dual damascene structure interconnect of a semiconductor device.
Figure 1B:
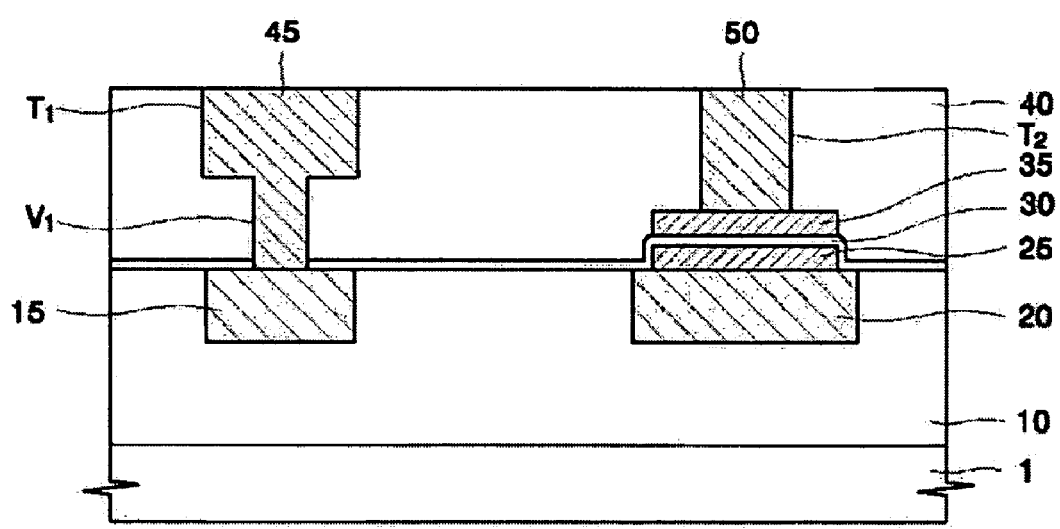
Figure 2A:
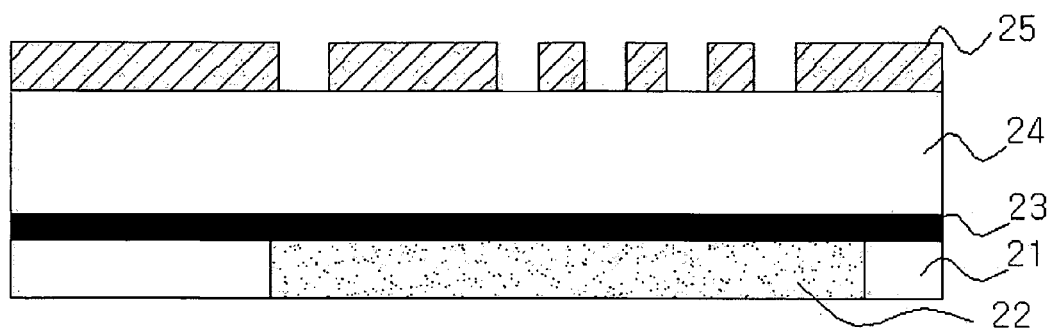
FIGS. 2a through 2j are cross-sectional views illustrating an example process of fabricating a MIM capacitor and a dual damascene structure interconnect of a semiconductor device performed in accordance with the teachings of the present invention.

FIGS. 2a through 2j are cross-sectional views illustrating an example process of fabricating a MIM capacitor and a dual damascene structure interconnect of a semiconductor device. Referring to FIG. 2a, a first insulating layer 21 is deposited on a substrate (not shown) having at least one active or passive structure (e.g., a transistor or resistor). A mask pattern is formed on the first insulating layer 21. A dry etching process is then performed using the mask pattern as an etch mask to form a trench. A first conducting material is deposited in the trench. A CMP process is performed to planarize the surface of the resulting structure to form a first metal interconnect 22. In the illustrated example, the CMP process is performed until the top surface of the first insulating layer 21 is exposed. The first conducting material is used to form a lower metal interconnect 22 to apply a bias voltage to a lower electrode of a capacitor to be formed later.

A second insulating layer 23 and a third insulating layer 24 are sequentially deposited over the first insulating layer 21 and the first conducting material 22. A first mask pattern 25 is formed on the third insulating layer 24. In the illustrated example, the second insulating layer 23 is preferably made of a material selected from nitride, silicon carbide (SiC) and/or aluminum oxide. In the illustrated example, the third insulating layer 24 is used as an ILD layer and is preferably made of silicon oxide.

Figure 2B:
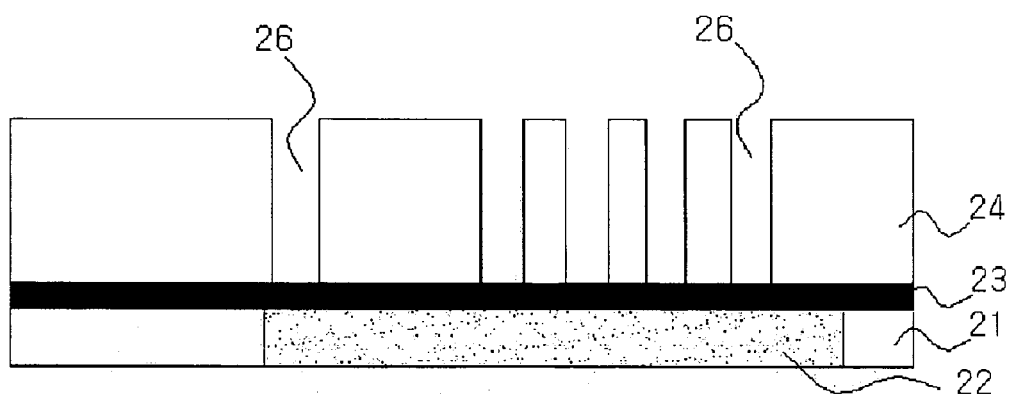

Referring to FIG. 2b, via holes 26 are formed by performing a dry etching process using the first mask pattern 25. Some of the via holes are used as contact plugs which connect the lower metal interconnect to the lower electrode of the capacitor. The remainder of the via holes 26 function as an interconnect which supplies a bias voltage applied from a pad (not shown) to the lower metal interconnect 22.

Figure 2C:
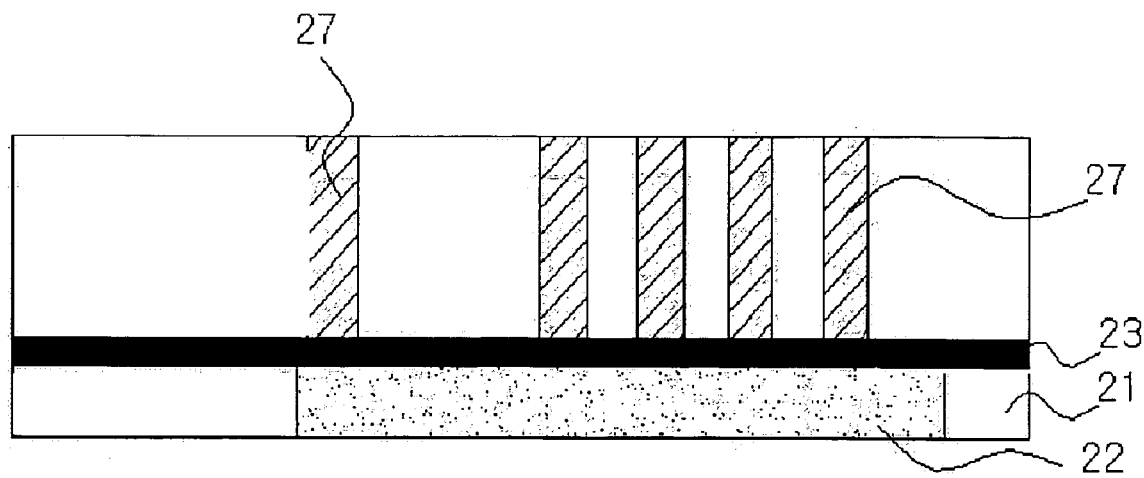

Referring to FIG. 2c, a photoresist 27 is spin-coated on the entire surface of the resulting structure as an insulator. As a result, the via holes 26 are filled with the photoresist 27. Subsequently, a baking process is performed at a temperature between 250° C. and 350° C. to harden the photoresist 27 within the via holes 26. Next, an etch-back process is performed to remove the photoresist which is not within the via holes 26. Through the damascene process as described above, simplification and efficiency of the control processes are readily achieved.

Figure 2D:
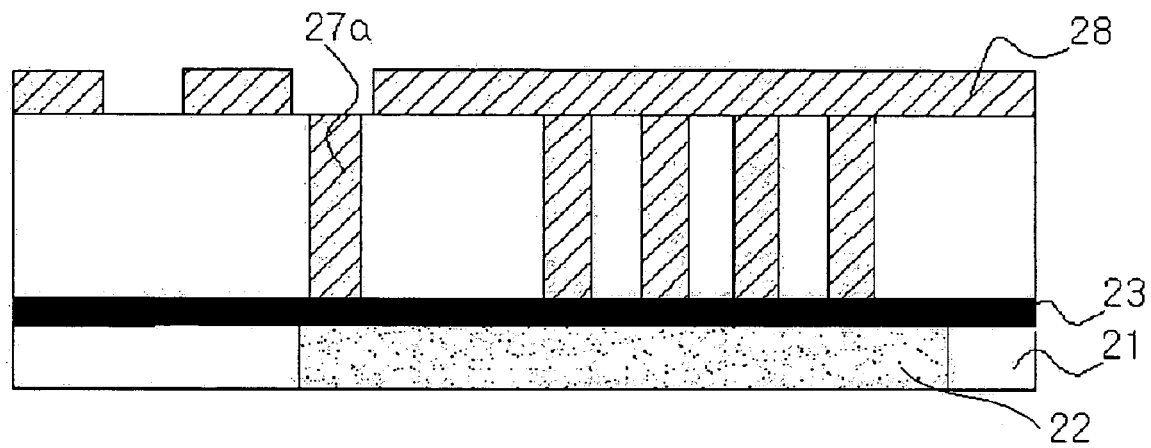

Referring to FIG. 2d, a mask pattern which exposes the area of the via hole 27a which comes into contact with the pad and covers the other area(s) 28 is formed on the surface of the resulting structure.

Figure 2E:
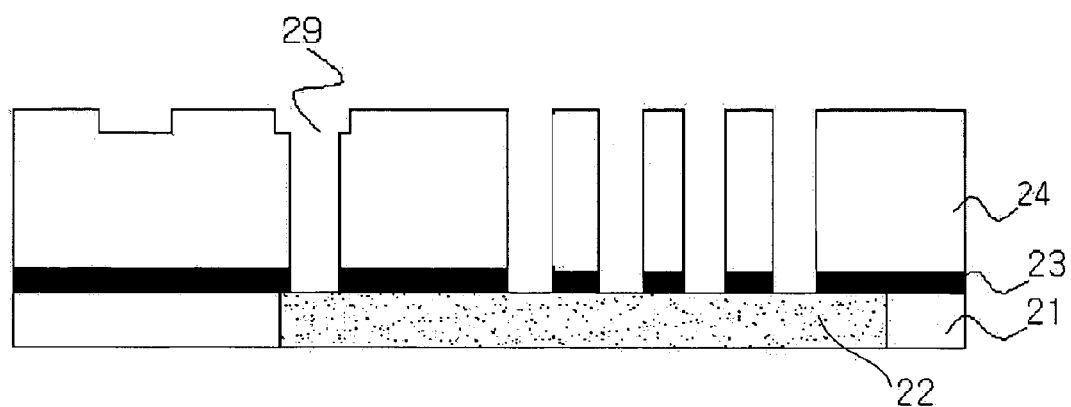

Referring to FIG. 2e, a dry etching process is performed using the mask pattern as an etch mask to form a trench 29. The trench area is wider than the via hole area. Next, a wet etching process is performed to remove the etch mask and, simultaneously, to remove the photoresist 27 and the second insulating layer 23 from within the via holes.

Figure 2F:
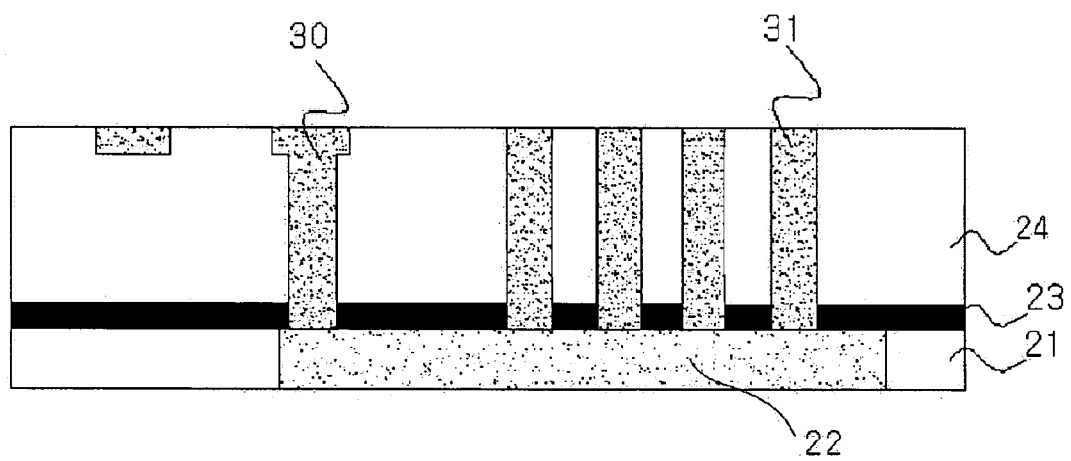

Referring to FIG. 2f, a second conducting material is filled into the via holes and the trench to form a contact plug 30 connected to the lower interconnect and other contact plugs 31 in contact with the lower electrode of the capacitor. In the illustrated example, the second conducting material is selected from TaN, TiN and/or WN. In addition, the second conducting material may be a single layer of TaN, TiN, or WN, or a multi-layer comprising TaN, TiN, and/or WN. In addition, a Cu layer may be added to the single layer of TaN, TiN, or WN and/or to the multi-layer comprising TaN, TiN, and/or WN. Subsequently, a CMP process is performed to planarize the surface of the resulting structure.

Figure 2G:
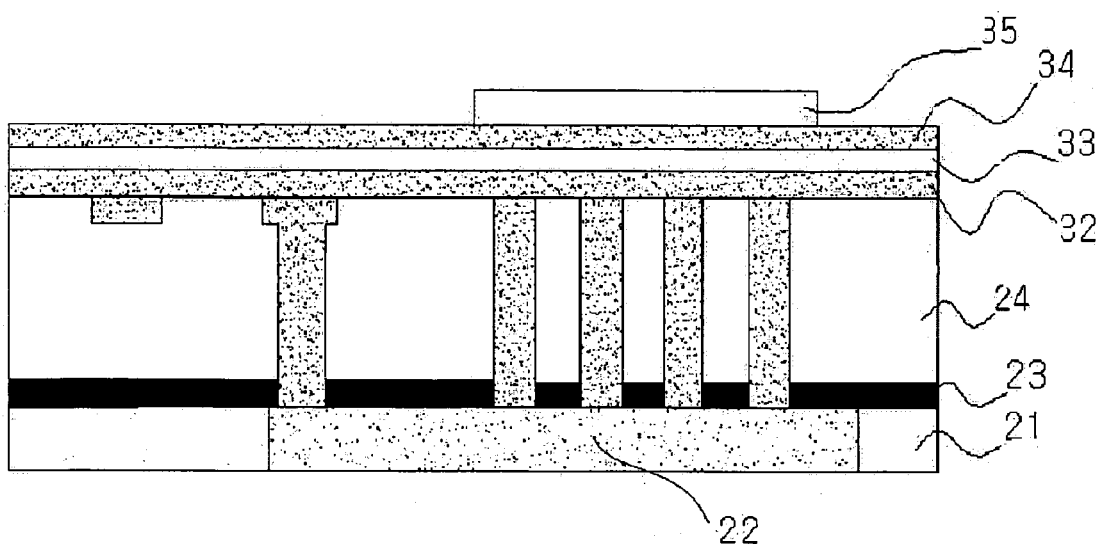

Referring to FIG. 2g, a metal layer 32 for the lower electrode of the capacitor, a capacitor insulating layer 33, and a metal layer 34 for the upper electrode of the capacitor are sequentially deposited on the third insulating layer. Next, a photoresist pattern 35 for the MIM capacitor is formed on the metal layer 34 for the upper electrode of the capacitor by a well-known photolithography process. In the illustrated example, the metal layers 32 and 34 for the upper electrode and the lower electrode of the capacitor are made of a multi-layer comprising TiN and/or TaN. In addition, in the illustrated example, the capacitor insulating layer 33 is made of a material such as nitride, TEOS (TetraEthOxySilane) and/or $Ta_2O_5$.

Figure 2H:
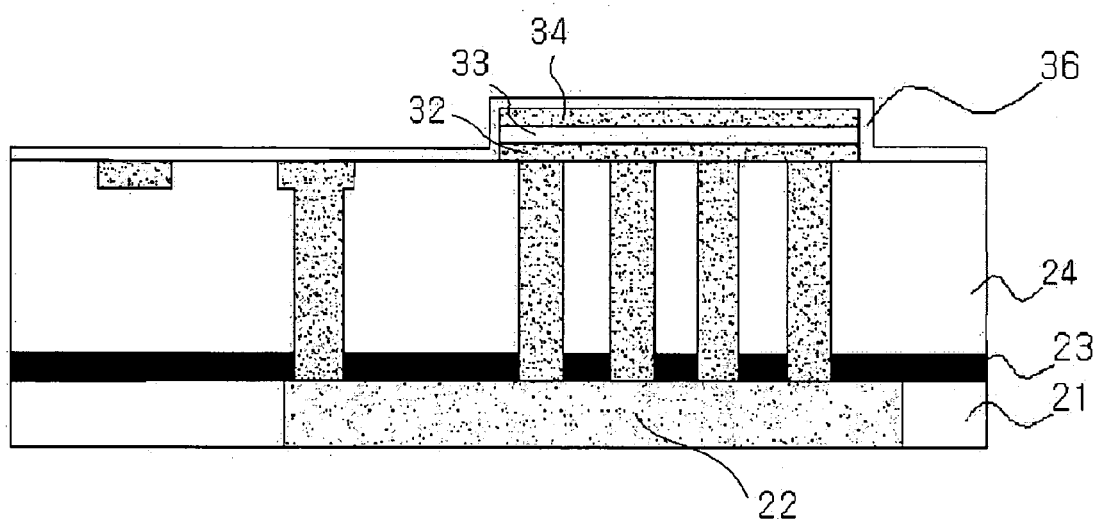

Referring to FIG. 2h, a dry-etching process is performed using the photoresist pattern as an etch mask to form the capacitor including the upper electrode 34, the lower electrode 32, and the capacitor insulating layer 33. In other words, the capacitor including the upper electrode 34, the lower electrode 32, and the capacitor insulating layer 33 is formed by just one etching process. Therefore, the times of the mask patterning process is reduced, leading to simplification of the unit process. Subsequently, the photoresist pattern is removed, and a fourth insulating layer 36 is deposited on the surface of the resulting structure as an etching stop layer.

Figure 2I:
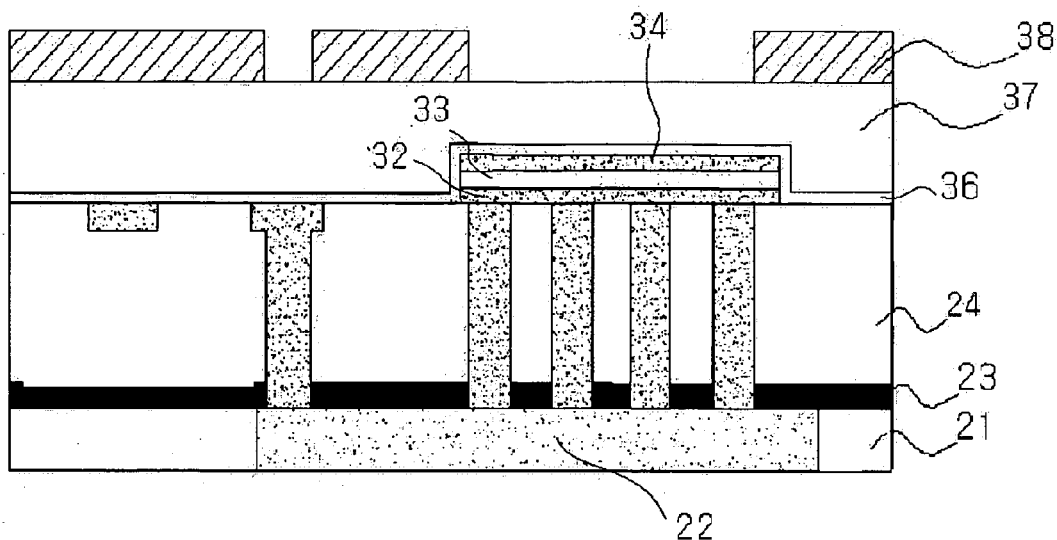

Referring to FIG. 2i, a fifth insulating layer 37 is deposited on the entire surface of the resulting structure as an ILD. Subsequently, a photoresist pattern is formed, which exposes the area for a contact plug for the upper electrode of the capacitor and the area for a via hole for a contact plug indirectly connected to the lower interconnect.

Figure 2J:
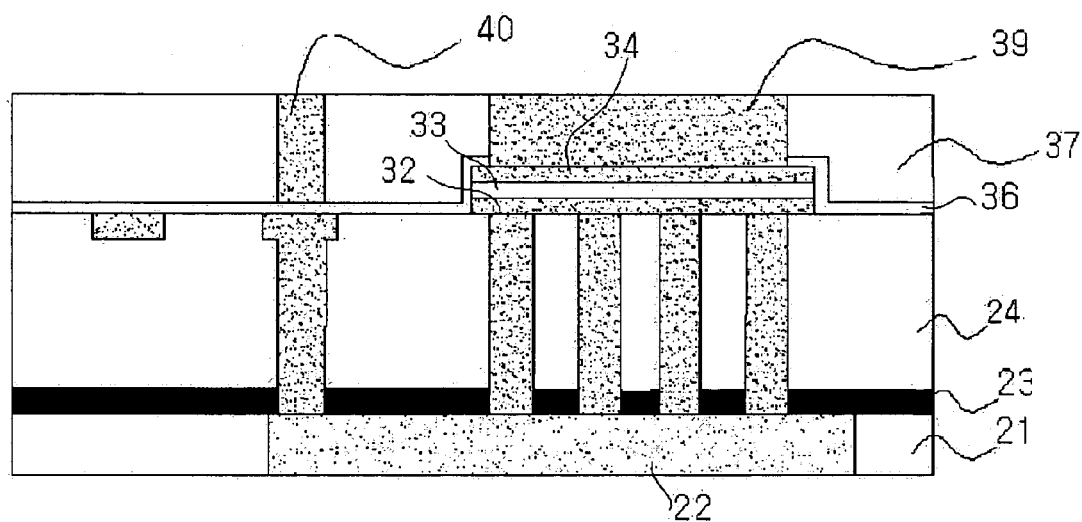

Referring to FIG. 2j, an etch process is performed on the fifth insulating layer 37 until the fourth insulating layer 36 is exposed. Subsequently, the exposed part of the fourth insulating layer 36 on the upper electrode 34 of the capacitor is removed by wet etching. Thus, a via hole and a trench are formed within the fourth and the fifth insulating layers.

A third conducting material is then filled into the via hole and the trench. Subsequently, a CMP process is performed to form the contact plug 39 in contact with the upper electrode 34 of the capacitor and another contact plug 40 indirectly connected to the lower interconnect 21. In the illustrated example, the fourth insulating layer 36 is preferably made of a material such as nitride, silicon carbide or aluminum oxide. The example fifth insulating layer 37 of FIG. 2j is preferably made of $SiO_2$ which is the identical material used in the second insulating layer 23. The third conducting material may be a single layer of TaN, TiN, or WN, or a multi-layer comprising TaN, TiN, and/or WN. In addition, a Cu layer may be added to the single layer of TaN, TiN, or WN and/or to the multi-layer comprising TaN, TiN, and/or WN for the third conducting material.

From the foregoing, persons of ordinary skill in the art will appreciate that the above-described process of fabricating a MIM capacitor and a dual damascene structure simultaneously forms both the contact plug and the capacitor using one unit process, thereby simplifying the manufacturing process and reducing the manufacturing cost.

Although certain example methods, apparatus and articles of manufacturing have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method of fabricating a MIM capacitor of a semiconductor device comprising:
   forming a lower interconnect on a semiconductor substrate;
   sequentially depositing second and third insulating layers over the lower interconnect;
   performing a first damascene process to form first and second via holes and a first trench within the second and the third insulating layers;
   filling the first and second via holes and the first trench with a conductive material to form a first contact plug connected to the lower interconnect and a second contact plug to be in contact with a lower electrode of a MIM capacitor;
   forming the MIM capacitor over the second contact plug;
   sequentially depositing fourth and fifth insulating layers;
   performing a second damascene process to form a third via hole and a second trench within the fourth and the fifth insulating layers; and
   filling the third via hole and the second trench to form a third contact plug in contact with the upper electrode of the capacitor and a fourth contact plug connected to the lower interconnect;
   wherein performing the first damascene process comprises:
   forming the first and second via holes within the third insulating layer;
   filling a photoresist material into the first and second via holes;
   hardening the photoresist;
   forming a mask pattern exposing the first via hole;
   forming a trench using the mask pattern as an etch mask;
   removing the etch mask; and
   removing the photoresist and the second insulating layer in the via holes.

2. A method as defined in claim 1, wherein forming the lower interconnect comprises:
   depositing a first insulating layer on the substrate;
   forming a mask pattern through the first insulating layer;

dry etching the first insulating material using the mask pattern as an etch mask to form a trench;

depositing a first conducting material in the trench; and performing a CMP process to planarize a resulting structure.

3. A method as defined in claim 1, wherein the photoresist is hardened at a temperature between about 250° C. and about 350° C.

4. A method as defined in claim 1, wherein forming the MIM capacitor comprises:

sequentially depositing a metal layer for the upper-lower electrode of the capacitor, a capacitor insulating layer, and a metal layer for the upper electrode of the capacitor on the third insulating layer;

forming a mask pattern for the MIM capacitor on the metal layer for the upper electrode of the capacitor; and etching metal layer for the upper electrode of the capacitor, the capacitor insulating layer, and the metal layer for the lower electrode of the capacitor while using the mask pattern as an etch mask.

5. A method as defined in claim 1, wherein the second and the forth insulating layers comprise at least one of nitride, silicon carbide or aluminum oxide.

6. A method as defined in claim 1, wherein the third insulating layer and the fifth insulating layer comprise $SiO_2$.

7. A method as defined in claim 1, wherein the second and the third conducting layers comprises a single layer of TaN, TiN, or WN, or a multi-layer comprising at least one of TaN, TIN, or WN.

8. A method as defined in claim 7, wherein a Cu layer is added to the single layer of TaN, TiN, or WN or to the multi-layer of at least one of TaN, TIN, or WN.

9. A method as defined in claim 1, wherein the lower electrode and the upper electrode of the MIM capacitor are multi-layer structures comprising TaN or TiN.

10. A method as defined in claim 1, wherein the capacitor insulating layer comprises nitride, TEOS, or $Ta_2O_5$.

* * * * *